(12) United States Patent
Anderson et al.

(10) Patent No.: US 7,382,059 B2
(45) Date of Patent: Jun. 3, 2008

(54) SEMICONDUCTOR PACKAGE STRUCTURE AND METHOD OF MANUFACTURE

(75) Inventors: Harold G. Anderson, Chandler, AZ (US); Cang Ngo, Mesa, AZ (US); Yong Li Xu, Phoenix, AZ (US); James Mohr, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 209 days.

(21) Appl. No.: 11/281,141

(22) Filed: Nov. 18, 2005

(65) Prior Publication Data

US 2007/0114676 A1    May 24, 2007

(51) Int. Cl.
*H01L 23/28* (2006.01)

(52) U.S. Cl. ............... 257/787; 257/788; 257/789; 257/795; 257/E23.02; 257/E23.116; 257/E23.121

(58) Field of Classification Search ........ 257/678–733, 257/787–796, E23.001–E23.194
See application file for complete search history.

(56) References Cited

U.S. PATENT DOCUMENTS

| | | |
|---|---|---|
| 4,240,099 A | 12/1980 | Brandt et al. |
| 2005/0184405 A1* | 8/2005 | Bai et al. .................... 257/787 |

* cited by examiner

*Primary Examiner*—Jasmine Clark
(74) *Attorney, Agent, or Firm*—Kevin B. Jackson

(57) ABSTRACT

In one embodiment, a semiconductor package is formed by adding a layer of particles to desired portions of a packing substrate. The layer of particles forms a matrix of crevices that provides a micro-lock feature for mechanically locking or engaging encapsulating materials.

19 Claims, 2 Drawing Sheets

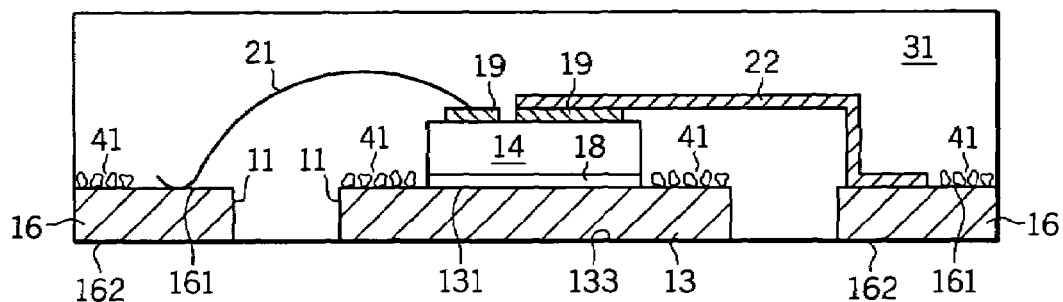
FIG. 1
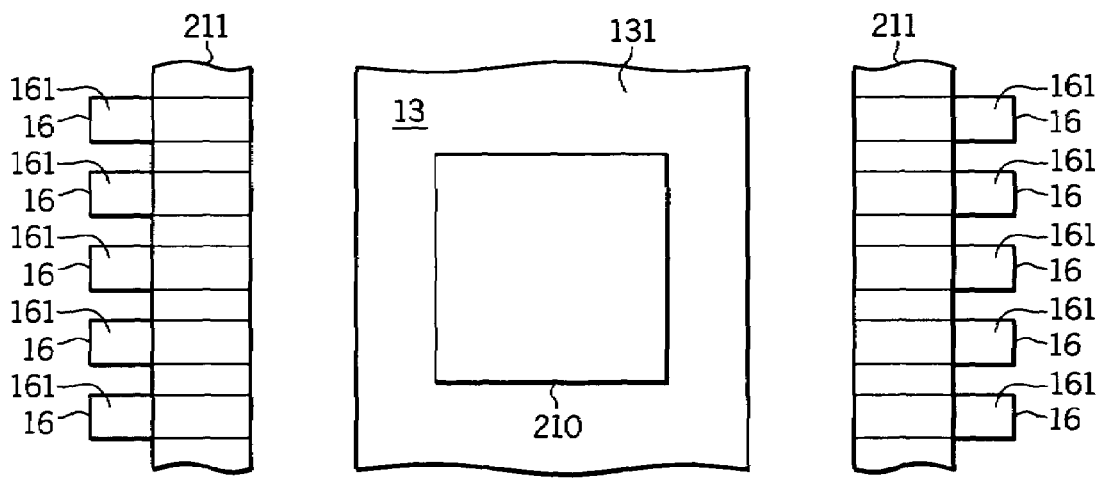
FIG. 2
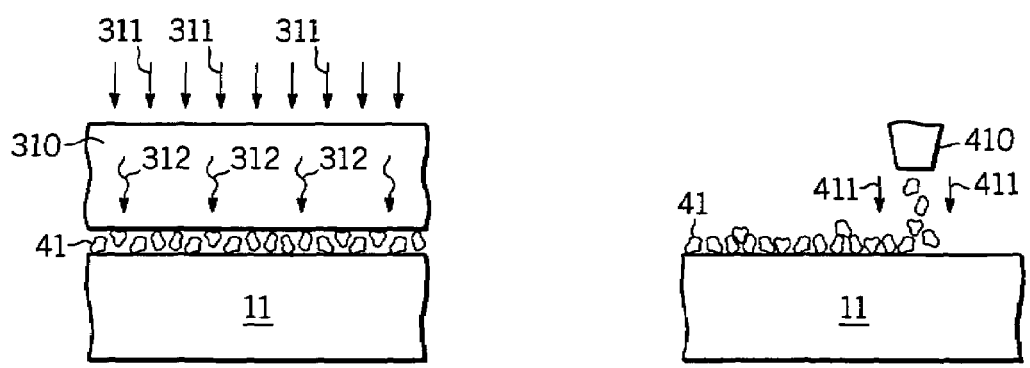
FIG. 3          FIG. 4

SEMICONDUCTOR PACKAGE STRUCTURE AND METHOD OF MANUFACTURE

FIELD OF THE INVENTION

This invention relates generally to semiconductor devices, and more specifically to semiconductor package structures and methods of their manufacture.

BACKGROUND OF THE INVENTION

Plastic encapsulated devices are a typical type of packaged device used in the semiconductor industry. In plastic encapsulated devices, semiconductor chips or devices are attached to laminate substrates or conductive metal lead frames. The chips are attached using for example, thermoset epoxies, solder alloys, or by eutectic wetting. The semiconductor chips are then connected to conductive leads using wire bonds and/or conductive clip structures. The assembly is then encapsulated with an epoxy mold compound and separated into individual packaged units.

Improving the adhesion between the epoxy mold compound and the lead frame or substrate continues to be a major challenge in semiconductor packaging. The long term reliability of a device is put at risk when the epoxy mold compound begins to separate from the lead frame or substrate surface. This separation can induce stress on the semiconductor chip, which can result in the chip separating from the lead frame or substrate, or result in the chip itself cracking. Additionally, when the epoxy mold compound separates, a path for moisture or other contaminates is created, which can further impact the reliability of the packaged device.

Various techniques have been tried to improve the adhesion characteristics of epoxy mold compounds. The techniques include using adhesion promoter additives in the epoxy mold compounds; bead blasting, laser ablating or etching the lead frames or substrates to remove material from their surfaces; removing material to form mold lock structures, or adding dummy structures to the lead frames such as wire bonds. However, these approaches have had limited success, and adhesion problems still exist and continue to be a problem in the plastic encapsulated packages.

Accordingly, a structure and method of assembly are need that further improve the adhesion between epoxy mold compounds and conductive lead frames and/or laminate substrates.

BRIEF DESCRIPTION OF THE DRAWINGS

FIG. 1 illustrates an enlarged cross-sectional view of a semiconductor structure in accordance with an embodiment of the present invention;

FIG. 2 illustrates a top view of a portion of the semiconductor structure of FIG. 1 at an earlier step in fabrication;

FIG. 3 illustrates a partial side view of a portion of a sub-assembly during a fabrication process in accordance with an embodiment of the present invention;

FIG. 4 illustrates a partial side view of a portion of a sub-assembly during a fabrication process in accordance with another embodiment of the present invention.

DETAILED DESCRIPTION OF THE DRAWINGS

Figure 5:
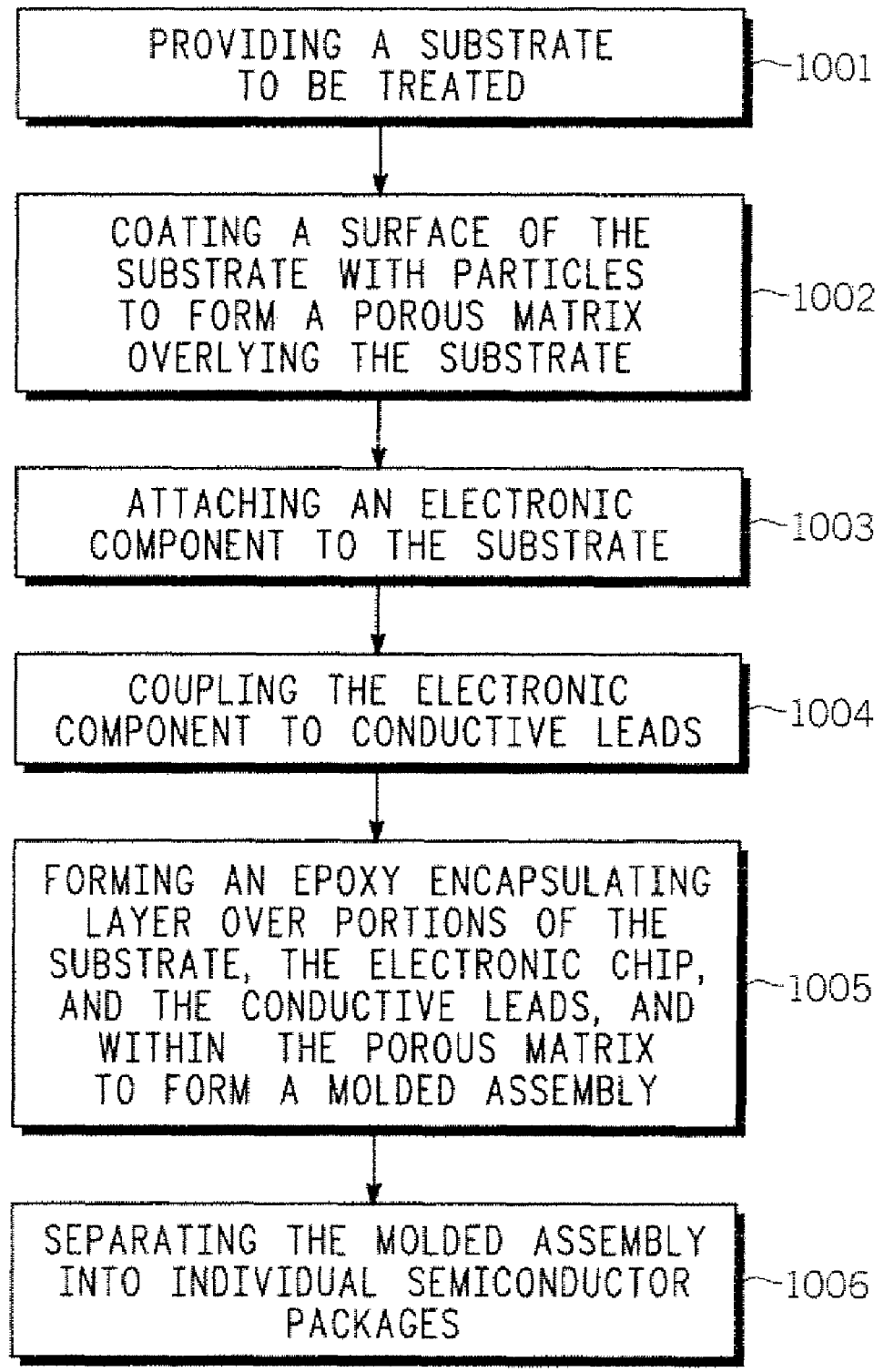
FIG. 5 illustrates a process flow for the manufacture of a semiconductor structure in accordance with the present invention.

For ease of understanding, elements in the drawing figures are not necessarily drawn to scale, and like element numbers are used where appropriate throughout the various figures. Although the embodiment shown in FIG. 1 is a quad flat pack no lead (QFN) configuration, those skilled in the art will understand the present invention is relevant to any plastic encapsulation electronic package using conductive substrates and plastic epoxy resins. Other relevant packages include those that have surface area available for forming features for engaging plastic encapsulation layers. Such packages include, but are not limited to, QFP, DFN, DIP, SOIC, and PLCC packages.

In general, the present invention pertains to an electronic package structure and a method of manufacture where the surface topography of the supportive substrate is modified by adding or embedding material to a surface of the supportive substrate. In a preferred embodiment, the material added or embedded comprises particles that form a matrix of shapes, crevices, or cavities. During a molding or encapsulation process, liquid epoxy mold compound fills the crevices to form a mechanical lock feature when the This provides, among other things, a mechanical lock feature when an epoxy mold compound solidifies. This results in an improved adhesion between the epoxy mold compound and the supportive substrate. The present invention is further understood by turning now to FIGS. 1-5.

FIG. 1 shows an enlarged cross-sectional view of a semiconductor or electronic package structure or device 10 in accordance with an embodiment of the present invention. Device 10 comprises a substrate, conductive substrate or lead frame 11. In the embodiment shown, substrate 11 comprises a flag, die attach paddle, or die attach portion 13 and conductive leads or plurality of leads 16 in spaced relationship or in proximity to flag 13. Flag 13 includes opposing major surfaces 131 and 132, with an electronic chip 14 attached at or overlying major surface 131 with a die attach layer 18. Leads 16 also include major opposing surfaces 161 and 162.

Conductive pads 19 on electronic chip 14 are electrically coupled to leads 16 using conductive connective structures, which comprise for example, wire bonds 21 and/or conductive straps or clips 22. In an alternative embodiment, the conductive connective structures conductive bumps or pillars formed on conductive pads 19, and electronic chip 14 is mounted to substrate 11 in flip chip manner. By way of example, electronic chip 14 comprises a power MOSFET, bipolar power transistor, insulated gate bipolar transistor, thyristor, diode, sensor, optical device, or the like, and may include further functionality such as logic and/or memory components or circuitry.

A molded encapsulating or passivating layer 31 covers and protects portions of package 10. By way of example, encapsulating layer 31 comprises a plastic epoxy resin material, and is formed using conventional molding techniques. By way of example, flag 13 and leads 16 comprise a material such as a copper alloy (e.g., TAMAC 5 or CDA194), a copper plated iron/nickel alloy (e.g., copper plated Alloy 42), plated aluminum, plated plastic, or the like. Plated materials include copper, silver, or multi-layer plating such nickel-palladium and gold.

In accordance with the present invention, device 10 further includes a matrix of particles, a coating of, particles 41 added to, overlying, partially embedded into portions of major surfaces 131 and 161 of flag 13 and leads 16 respectively. More particularly, coating of particles 41 comprises a localized population of symmetrical and/or random shaped particles formed on major surfaces 131 and/or 161. Coating of particles 41 is not formed in the present invention by removing material from major surfaces 131 and/or 161, but by adding more material in the form of particles thereto.

By way of example, particles 41 comprise a coating of metal and/or ceramic particles that form web-like, porous, or crevice-like features on major surfaces 131 and/or 161 to engage with or mechanically lock with encapsulation layer 31. In one embodiment, particles 41 comprise copper, nickel, or a nickel ceramic. In one embodiment, particles 41 have an average diameter or size from about $2.0 \times 10^{-6}$ meters to about $2.50 \times 10^{-5}$ meters. The particle size may be larger if there is sufficient surface area substrate 11 to form a web-like feature. In a further embodiment, particles 41 are deposited in those areas of package 10 prone to delamination such as those areas around the perimeter of flag 13 surrounding electronic chip 14. This is advantageous when size constraints prevent the use of other techniques such as etched or stamped mold locking grooves.

FIG. 2 shows a partial top view of lead frame or substrate 11 at an early step in fabrication before particles 41 are deposited on to major surfaces 131 and 161 of flag 13 and leads 16 respectively. At the step, masking layers 210 and 211 are placed on lead frame 11 to cover or protect those portions of flag 13 and leads 16 where particles 41 will not be deposited. By way of example, such areas include those portions where electronic chip 14 will be attached to flag 13, and where conductive connective structures 21 and 22 will be bonded or attached to leads 16. By way of example, masking layers 210 and 211 comprise a polymer protective tape, photoresist layers, or other protective materials.

FIGS. 3 and 4 show partial side views of preferred methods of depositing particles 41 onto lead frame or substrate 11. In FIG. 3, a sintered material (e.g., powdered metal and/or ceramic) is deposited onto a major surface of substrate 11, and a heated mechanical press 310 applies downward force (represented by arrows 311) and heat (represented by arrows 312 to sinter particles 41 and substrate 11 together. By way of example, when substrate 11 comprises copper, particles 41 comprise copper flakes or copper powder. When particles 41 and substrate 11 are pressed together under heat and pressure, particles 41 bond to substrate 11 and form a porous matrix or crevices on substrate 11 in accordance with the present invention.

In FIG. 4, a thermal, plasma, or cold spray process is shown. In a thermal or plasma spray process, high pressure gas/air is used to atomize and propel heated particles 41 through a nozzle 410 towards (represented by arrows 411) substrate 11 where particles 41 impact a major surface of substrate 11 (e.g., major surfaces 131 and/or 161 as shown in FIGS. 1 and 2), and flatten or deform into irregular shapes and bond to substrate 11 to form a porous matrix or crevices on substrate 11 in accordance with the present invention. In a cold spray process, a high pressure gas propels a powder of particles 41 that are heated to temperature where upon impact with substrate 11, particles 41 deform into irregular shapes, bond with substrate 11, and form a coating in accordance with the present invention. The density of particles 41 formed or coated overlying substrate 11 is controlled by the size of particles and the volume of particles deposited over a unit area of major surface.

FIG. 5 shows an example of a process flow or method of manufacturing a semiconductor package in accordance with the present invention. In step 1001, a substrate such as substrate 11 is provided for coating. In this step, optional masking layers are added to major surfaces of substrate 11 so that particles 41 deposited in desired locations only. Alternatively, all major surfaces of substrate 11 are treated. In step 1002, a coating of particles 41 is deposited or formed on, overlying, or partially embedded within substrate 11. By way of example, one of the coating processes described in conjunction with FIGS. 3 and 4 is used to deposit particles 41 to form a web-like layer, porous matrix of particles, or crevice-like layer.

Next, in step 1003 electronic chip 14 is attached to substrate 11 using die attach layer 18. By way of example, die attach layer 18 comprises a soft solder, a conductive epoxy, or a eutectic solder layer. In step 1004, conductive connective structures 21 and/or 22 are attached to electronic chip 14 and respective leads 16 using conventional wire bonding or attach techniques to form a sub-assembly structure. Next, the sub-assembly structure is placed in molding apparatus, and epoxy mold compound is used to form encapsulating layer 31 as illustrated in step 1005. In accordance with the present step, encapsulating layer 31 mechanically locks or engages with particles 41 to enhance the adhesion of the plastic mold compound to substrate 11. In other words, encapsulating layer 31 is formed within or flows into porous matrix of particles 41 during the molding process thereby improving the adhesion between encapsulating layer 31 and that portion of the package where particles 41 are bonded thereto. in a further step 1006, the encapsulated structure is then separated into individual plastic encapsulated semiconductor packages such semiconductor package 10 shown in FIG. 1.

In view of all the above, it is evident that a semiconductor package structure and method of manufacture have been provided that improve the adhesion between packaging materials such as package substrates and encapsulation layers. By adding a layer of particles to the package substrate in desired locations, the present invention forms a matrix of shapes or crevices that provide a structure for forming mechanical locks with the encapsulation layer.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor package structure device comprising:
a substrate having a major surface;
an electronic chip attached to one portion of the major surface;
a porous matrix of particles bonded to other portions of the major surface; and
an encapsulation layer covering the substrate, wherein the encapsulation layer is within the porous matrix or particles, wherein the porous matrix of particles is configured for enhancing adhesion between the substrate and the encapsulation layer.

2. The structure of claim 1 wherein the substrate comprises:
a conductive flag where the electronic chip is attached; and
a plurality of conductive leads in spaced relationship with the conductive flag, and wherein the porous matrix of particles is bonded to portions of the conductive flag.

3. The structure of claim 2 wherein the porous matrix of particles is bonded to portions of the plurality of conductive leads.

4. The structure of claim 2 further comprising conductive connective portions electrically coupling the electronic chip to the plurality of leads.

5. The structure of claim 4, wherein the conductive connective structures comprise wire bonds.

6. The structure of claim 4, wherein the conductive connective structures comprise clips.

7. The structure of claim 1 wherein the encapsulation layer comprises an epoxy mold compound.

8. The structure of claim 1, wherein the porous matrix or particles comprises a layer of particles having irregular shapes and diameters in a range from about $2.0 \times 10^{-6}$ meters to about $2.5 \times 10^{-5}$ meters.

9. The structure of claim 1 wherein the substrate comprises copper.

10. The structure of claim 1 wherein the porous matrix of particles comprises a metal.

11. The structure of claim 10, wherein the porous matrix of particles comprises copper.

12. The structure of claim 10, wherein the porous matrix of particles comprises nickel.

13. A semiconductor packaged device comprising:
a conductive die attach paddle having a first major surface;
conductive leads having a second major surface, wherein the conductive leads are in proximity to the conductive die attach paddle;
a semiconductor device attached to a portion of the first major surface;
conductive connective structures electrically coupling the semiconductor device to the conductive leads;
a porous matrix of particles bonded to other portions of the first major surface; and
a plastic encapsulating layer formed over the conductive die attach paddle and the semiconductor device, wherein the porous matrix of particles engages the plastic encapsulating layer thereby enhancing adhesion between the conductive die attach paddle and the plastic encapsulating layer.

14. The device of claim 13, wherein the porous matrix or particles is further bonded to portions of the second major surface, wherein the porous matrix of particles further enhances adhesion between the conductive leads and the plastic encapsulating layer.

15. The device of claim 13, wherein the porous matrix of particles comprises a layer of irregular shaped metal particles having diameters in a range from about $2.0 \times 10^{-6}$ meters to about $2.5 \times 10^{-5}$ meters.

16. The device of claim 13, wherein the conductive connective structures comprise wire bonds and clips.

17. The device of claim 13 wherein the porous matrix of particles comprise copper.

18. The structure of claim 1, wherein the porous matrix of particles comprises a ceramic.

19. The structure of claim 18, wherein the porous matrix of particles comprises a nickel ceramic.

* * * * *